US006228667B1

(12) United States Patent
Cathey, Jr. et al.

(10) Patent No.: US 6,228,667 B1
(45) Date of Patent: May 8, 2001

(54) FIELD EMISSION DISPLAYS WITH REDUCED LIGHT LEAKAGE

(75) Inventors: David A. Cathey, Jr., Boise; John K. Lee, Meridian; Tianhong Zhang; Behnam Moradi, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/607,563

(22) Filed: Jun. 29, 2000

Related U.S. Application Data

(62) Division of application No. 09/256,882, filed on Feb. 24, 1999, now Pat. No. 6,133,056, which is a division of application No. 08/922,871, filed on Sep. 3, 1997, now Pat. No. 5,956,611.

(51) Int. Cl.$^7$ .............. H01L 21/00
(52) U.S. Cl. .............. 438/20; 445/46; 445/51
(58) Field of Search .............. 438/20; 445/46, 445/51

(56) References Cited

U.S. PATENT DOCUMENTS

| | | | | |
|---|---|---|---|---|
| 4,701,349 | * | 10/1987 | Koyanagi et al. | 427/228 |
| 4,772,571 | * | 9/1988 | Scovell et al. | 437/200 |
| 5,103,272 | * | 4/1992 | Nishiyama | 357/23.4 |
| 5,319,279 | * | 6/1994 | Watanabe et al. | 313/309 |

* cited by examiner

*Primary Examiner*—Jey Tsai
*Assistant Examiner*—David A. Zarneke
(74) *Attorney, Agent, or Firm*—Trop, Pruner + Hu, PC

(57) ABSTRACT

Semiconductor devices may be made by forming a silicided layer on a silicon material such as that used to form the extractor of a field emission display. The silicided layer may be self-aligned with the emitter of a field emission display. It the silicided layer is treated at a temperature above 1000° C. by exposure to a nitrogen source, the silicide is resistant to subsequent chemical attack such as that involved in a buffered oxide etching process.

4 Claims, 7 Drawing Sheets

FIELD EMISSION DISPLAYS WITH REDUCED LIGHT LEAKAGE

This is a divisional of prior application Ser. No. 09/256,882 filed Feb. 24, 1999 now U.S. Pat. No. 6,133,056 which is a divisional of 08/922,871 filed Sep. 3, 1997 now U.S. Pat. No. 5,956,611.

STATEMENT AS TO FEDERALLY SPONSORED RESEARCH

This invention was made under Government support under Contract No. DABT63-93-C-0025 awarded by Advanced Research Projects Agency (ARPA). The Government has certain rights in this invention.

BACKGROUND OF THE INVENTION

This invention relates broadly to semiconductor devices, and to methods for making such devices and particularly to display devices such as field emission displays.

Because of their exceedingly small size, it is often very difficult to align one feature in a semiconductor device with another. The problem arises from the fact that once one feature is in place on a semiconductor layer it is very hard to subsequently align another feature with that feature. For example, it may be difficult to align an etching mask with the first feature because there is no physical way to guide the mask into alignment with the first feature.

One way of overcoming these problems is to self-align two features to one another. For example, one self-alignment technique is to use the gate electrode as a mask for the subsequent source/drain ion implantation. Because the gate electrode acts as a mask for the implantation, the source and drain regions become aligned to the gate electrode.

Self-alignment may be advantageous since it may allow devices to be made smaller because some misalignment tolerances need not be included in the design. These misalignment tolerances may require the device to be larger to compensate for the misalignment between features.

Moreover, in many applications the misalignment influences the operating effectiveness of the device. Thus, it is highly desirable to coordinate features such that subsequent features are aligned with previous ones.

Another example of a self-alignment technique applied to semiconductor devices arises in the field of field emission displays. Field emission displays use electron emission from an emitter to illuminate a screen which displays a corresponding image for the user. These devices can be used in a variety of electronic displays such as laptop computer displays.

In field emission displays it is desirable to align the extractor or grid to the emitter. The extractor, situated between the emitter and the screen, is charged such that it can extract electrons from the emitter and accelerate them toward the screen.

One technique for self-aligning the extractor to the emitter is to use a chemical mechanical polishing process. After the emitters are formed they may be covered with a generally conformal layer of oxide followed by a generally conformal layer of a conductive material such as silicon. Because of the conical shape of the emitter, the portion of the dielectric and conductive layers over the emitter, forms a hump or hillock on the semiconductor surface. By using a chemical mechanical polishing process the hillock can be removed down to the oxide layer, leaving in effect, an opening in the conductive layer which is self-aligned to the emitter. The conductive layer opening is self-aligned to the emitter because it was the shape of the emitter itself, in cooperation with the chemical mechanical polishing process, which defined the opening in the conductive layer. The conductive layer ultimately becomes the extractor or grid associated with the emitter after a portion of the oxide layer between the extractor and the emitter has been removed.

An emitter, formed over a junction in a semiconductor layer, can be controlled to emit electrons through its tip. These electrons pass from the emitter tip through the opening in the extractor and are accelerated by the extractor potential towards a screen. When the electrons hit the screen they cause luminescence which the user perceives as an image.

Sometimes field emission displays suffer from a leakage problem which causes lighter regions to appear on the screen. A leakage problem may arise from light that enters the junction under the emitter in one of several ways. Light can enter this region by being reflected back from the screen towards the underlying semiconductor layer. Also light from a variety of sources outside the display may enter the junction through the opening in the extractor and by actually passing through the extractor itself.

As a result of photoelectric affects, electrons may be created in the junction which are emitted through the emitter, operating the emitter even when the emitter is effectively turned off. Similarly, leakage from the junction to the underlying substrate may adversely affect the operation of the display.

The active matrix driving scheme of field emission displays requires integration of silicon devices and tips on a single silicon substrate. Such a scheme can be easily implemented by using MOS devices as shown in FIG. 1. Although this is a very efficient way of manufacturing small area field emission displays, it also suffers from serious drawbacks.

The main problem with the scheme illustrated in FIG. 1 is the fact that photons from the phosphor anode can easily pass through the extraction grid and consequently generate electron hole pairs in the MOS devices. Generated electrons will be attracted by the higher positive field in the tip area and cause a bright background. This problem is even more severe for color displays where three colors, red, blue, and green are used as the main ingredients of phosphor anodes. If the background light is not extremely dim, it can turn the wrong color on, cause cross talking among different colors, and distort the image quality of a display.

Light sensitivity is basically originated from the presence of the pn junction right under the tip, where generated electron hole pairs can be separated and find their paths to the tip area and substrate, respectively. This disclosure describes a new technique which can significantly reduce the light leakage problem.

SUMMARY OF THE INVENTION

In accordance with one aspect of the present invention, a process for forming a field emission display involves forming an emitter. A conductive layer is then formed over the emitter with an opening in the conductive layer being self-aligned to the emitter. A second layer is formed over the conductive layer with an opening in the second layer that is also self-aligned to the emitter.

In accordance with another aspect of the present invention, a process of forming a field emission display involves forming a grid with an opening self-aligned to the emitter. A light blocking layer is self-aligned on the grid to the opening in the grid.

In accordance with still another aspect of the present invention, a process for forming a field emission display with an emitter for emitting electrons which impact a screen, involves forming a silicon layer with an opening that is self-aligned to the emitter. A metal layer is deposited on the silicon layer and a silicide is formed where metal contacts the silicon layer. The metal not in contact with the silicon layer is then removed to self-align the silicide layer to the emitter.

In accordance with yet another aspect of the present invention, a field emission display includes an emitter and an overlaying extractor. A light blocking layer self-aligned to the emitter is formed on the extractor.

In accordance with still another aspect of the present invention, a method for forming a field emission display having an emitter that emits electrons which impact a screen, includes the step of forming a silicided grid with an opening over the emitter. The grid is treated to resist damage from an ensuing oxide etch.

In accordance with but another aspect of the present invention, a process of forming a field emission display includes the step of forming a grid with an opening self-aligned to an emitter. A light blocking layer is self-aligned on the grid to the opening in the grid. The light blocking layer is treated to resist damage from an ensuing oxide etch.

In accordance with another aspect of the present invention, a semiconductor device is made by the process that includes the step of forming a silicide. The silicide is exposed to a source of nitrogen at a temperature over 1000° C.

In accordance with still another aspect of the present invention, a computer system comprises a computer and a field emission display. The display includes a screen, an emitter and an extractor arranged such that the emitter can emit electrons through the extractor to impact the screen. The extractor is treated to prevent light from passing through the extractor.

DESCRIPTION OF THE PREFERRED EMBODIMENTS

Figure 1:
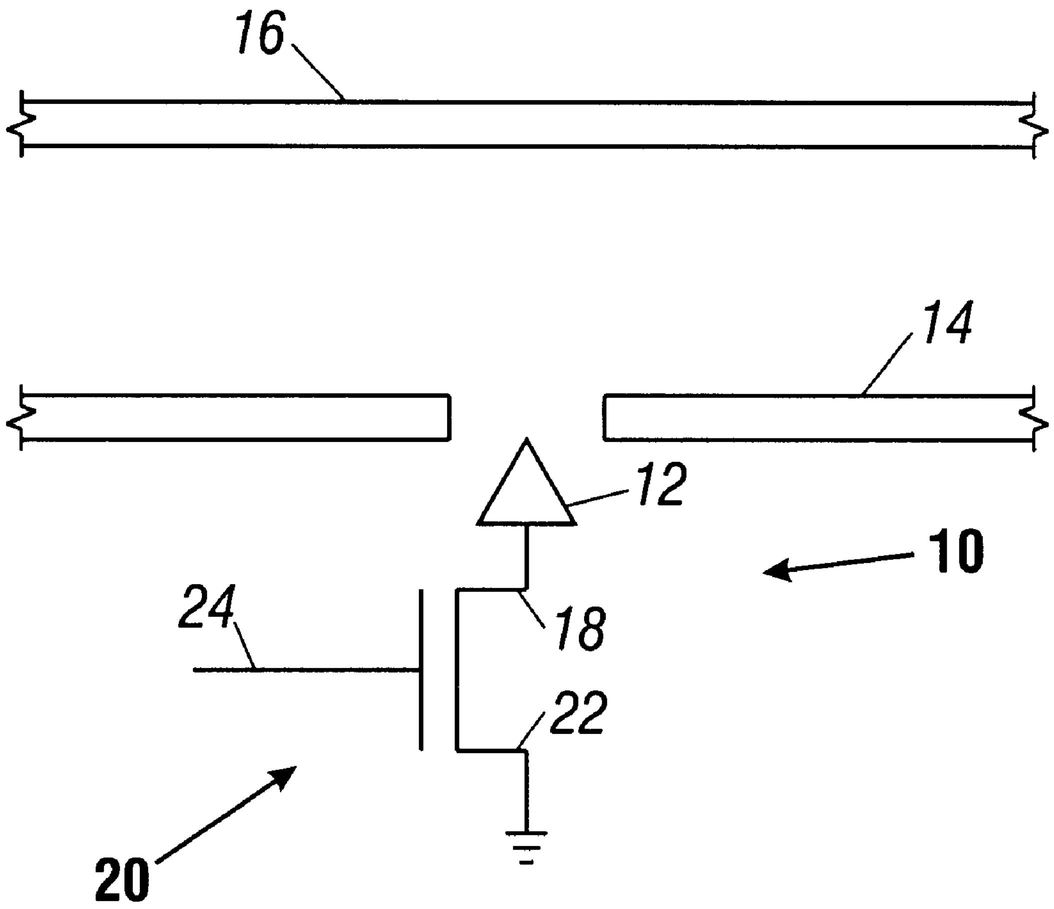
FIG. 1 is a schematic depiction of a conventional field emission display emitter.

Referring to the drawing wherein like reference characters are used for like parts throughout the several views, a field emission display 10 includes an emitter 12, an extractor or grid 14, and a screen 16, as shown in FIG. 1. The emitter 12 emits a stream of electrons past the positively charged extractor 14 so that they impact the screen 16. Since the screen 16 is electroluminescent, the impacting electrons cause an image to appear to the user on the opposite side of the screen 16.

The emitter 12, which may be formed on a semiconductor layer, is situated on the drain electrode 18 of a transistor 20 which includes a grounded source 22 and a gate 24. Control over the emitter 12 can be maintained by controlling the potential on the gate in accordance with conventional field effect transistor technology.

Figure 2:
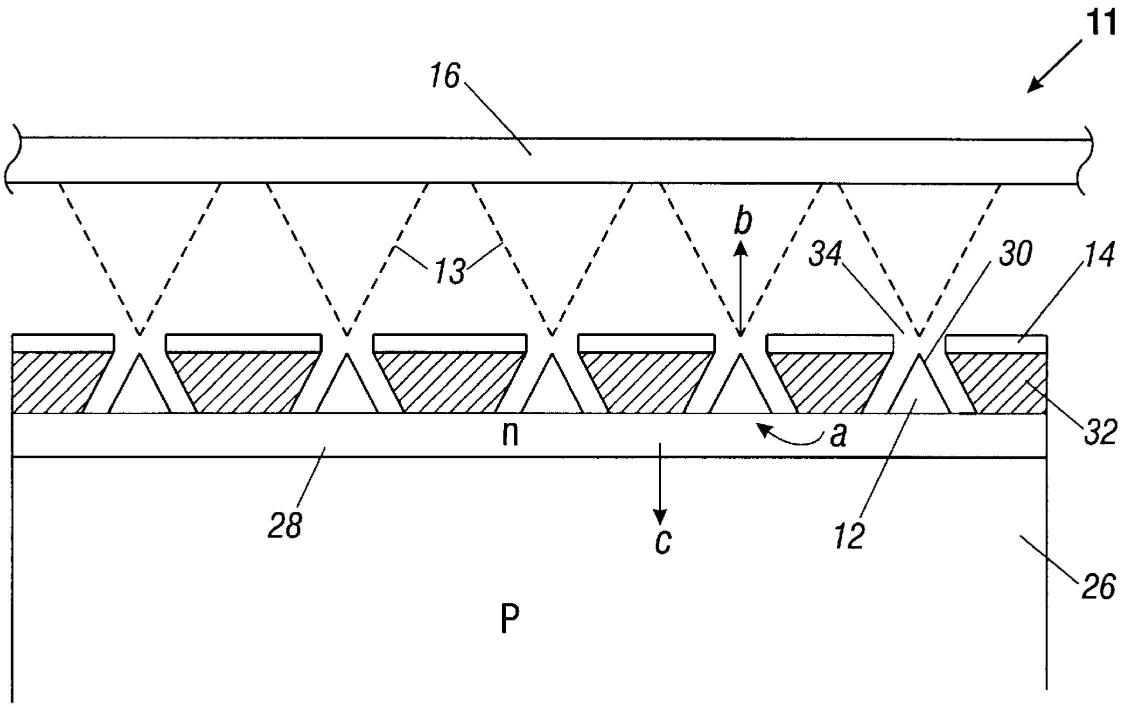
FIG. 2 is an enlarged, schematic cross-sectional depiction of a conventional field emission display of the type shown in FIG. 1.

Referring to FIG. 2, the display 10 may be implemented in the semiconductor layer 26 which advantageously may be formed of p-type silicon. A doped region 28 formed in the semiconductor layer 26 may be of a conductivity type opposite to the conductivity type of the semiconductor layer 26. Thus, the doped region 28, which acts as the drain of the transistor 20, may be formed by modifying the p-type semiconductor material 26 using conventional techniques to form an n-type doped region 28.

A plurality of emitters 12, situated directly on top of the semiconductor layer 26, are located in openings 30 in a surrounding oxide layer 32. Over the oxide layer 32 and extending slightly into the openings 30 is the grid or extractor 14 having openings 34. Spaced above the extractor 14 is the screen 16. Exemplary patents on field emission displays include U.S. Pat. Nos. 5,585,301, 5,525,865, 5,410,218, 5,151,061, 5,186,670 and 5,210,472, hereby expressly incorporated by reference herein.

The screen 16 is designed to shine light upwardly away from the display 10 to be perceived by the user. However, light from screen 16 also is reflected downwardly, together with light from the external surroundings. This downwardly directed light may impact the doped region 28 in one of two ways. It may pass through the openings 34 in the extractor 14 or it may pass through the extractor 14 and the dielectric layer 32 to impact the doped region 28. Light impacting the doped region 28 creates a photoelectric effect wherein mobile electrons may either pass from the doped region 28 into the substrate 26, as indicated by the arrow "c", or they may be drawn into the emitter 12 and pass upwardly towards the screen 16, as indicated by the arrows "a" and "b". Either of these effects is generally undesirable.

Ideally, the field emission display 10 is controlled by the conducting state of the transistor 20 as controlled by its gate bias. As a result of leakage created by stray light sources, the field emission display may not operate in accordance with its design parameters. This may include the possibility that display light may appear on the display 16 when the transistor 20 is in the "off" condition.

Conventionally the extractor 14 is made of silicon. Silicon passes some light which may adversely affect the operation of the display 11. The silicon forming the extractor may be made more opaque to light by coating it with appropriate materials to prevent light passage through the extractor 14.

The predominant source of leakage is due to light that passes through the extraction grid 14, as opposed to the tip or emitter 12. For example, for 100 $\mu m^2$ of cavity, tips 12 may occupy 2–3 $\mu m^2$ of the area and are as light sensitive as the material forming the grid. In other words, if grid 14 is replaced with silicide materials, light sensitivity can be improved by a factor of 43.

Certain silicided silicon materials are sufficiently opaque to prevent light entering the field emission display from passing through the extractor 14 and reaching the semiconductor junction 28. The inventors of the present invention have appreciated that approximately 500 angstroms of titanium silicide ($TiSi_x$) or titanium silicide nitride ($TiSi_xN_y$) are sufficiently opaque to light to prevent undesirable photon induced leakage. Those skilled in the art will appreciate other silicided materials which are also sufficiently opaque to light to prevent adverse leakage including silicides of tungsten, cobalt, niobium, and molybdenum.

Figure 5:
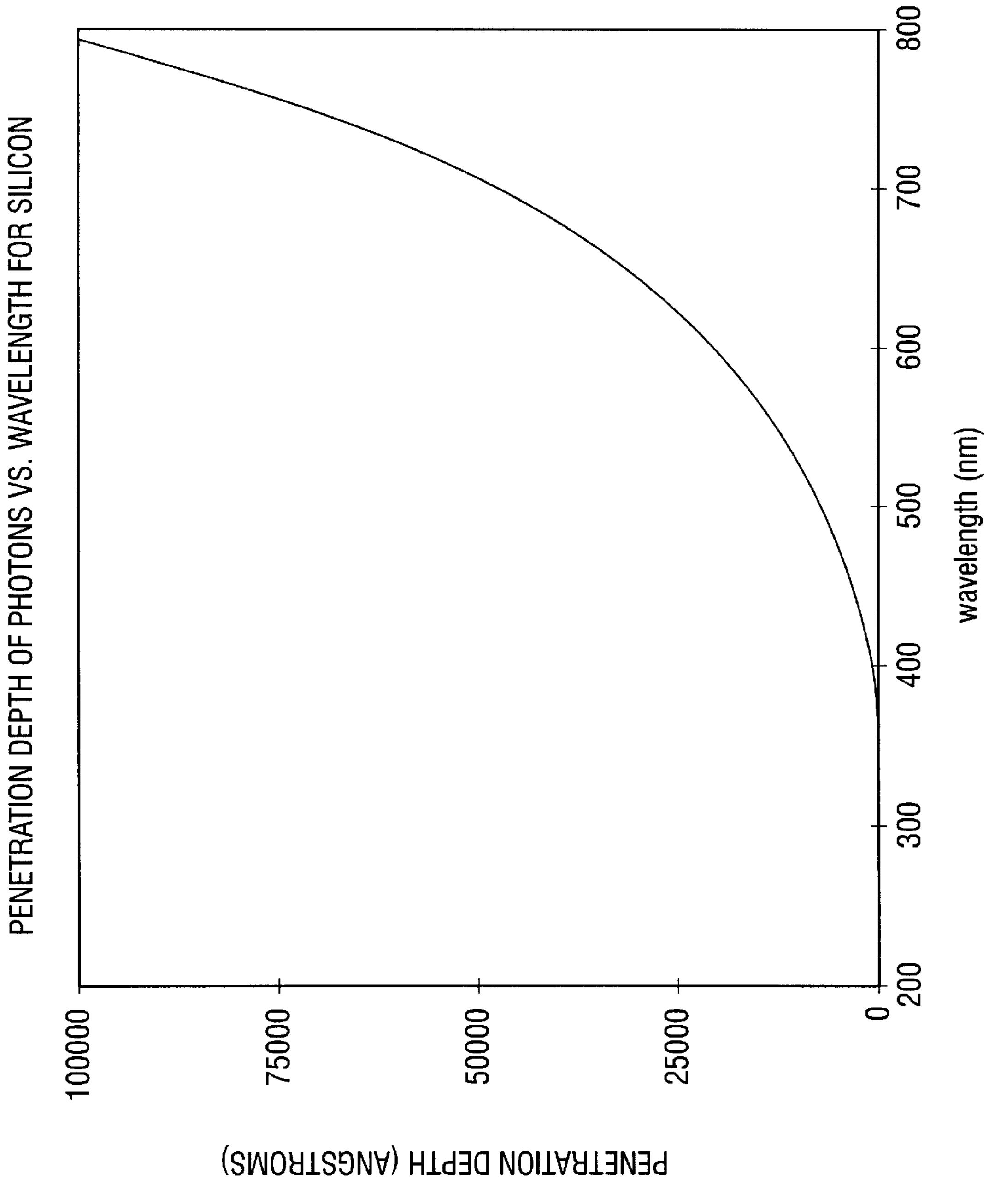
FIG. 5 is a graph of penetration depth of photons versus wavelength for silicon.
Figure 6:
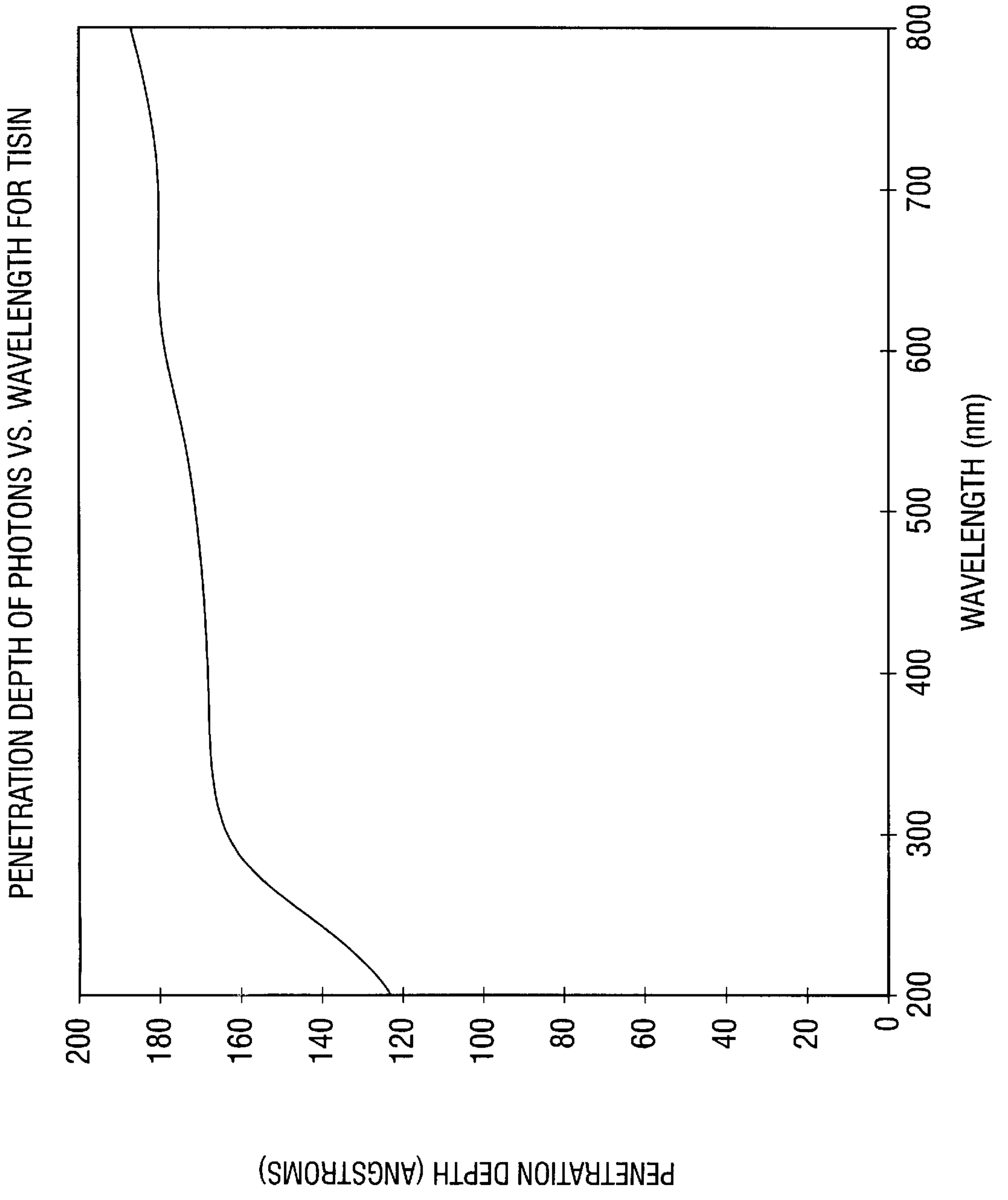
FIG. 6 is a graph of penetration depth of photons versus wavelength for $TiSi_xN_y$.

Light sensitivity can be reduced if the extraction grid is formed from materials with a large extinction coefficient. Since $a=4\pi K/\lambda$ (where a is the absorption coefficient, K is the extinction coefficient, and $\lambda$ is the wavelength), a high K results in a high absorption coefficient and less light penetration (penetration depth is inversely proportional to the absorption coefficient). Photons penetrate silicon thickness of approximately 10,000 Angstroms at wavelengths of 400 to 800 nanometers (nm.) as shown in FIG. 5. In comparison, photons penetrate through only about 120 to 180 Angstroms of titanium silicide nitride ($TiSi_xN_y$) at wavelengths of 200 to 800 nms. as shown in FIG. 6.

Figure 3A:
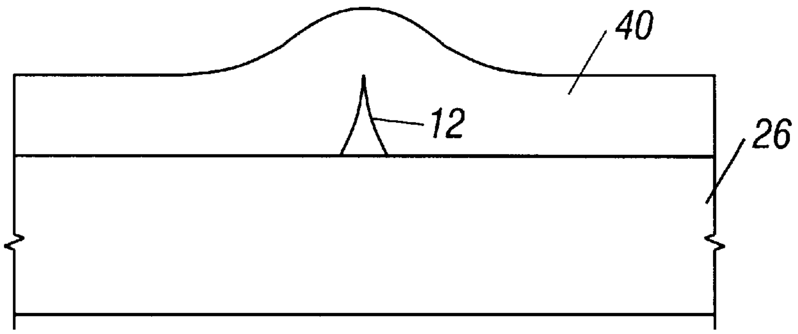
FIGS. 3*a*–3*f* are an enlarged, cross-sectional view showing the process steps utilized in forming one of the emitters in a field emission display.

A process for forming an improved device of the type shown in FIG. 2, with reduced light leakage, many utilize chemical mechanical polishing techniques disclosed for example in U.S. Pat. No. 5,229,331 to Doan et al. hereby expressly incorporated by reference herein. The aforementioned patent describes the technique for forming the emitters 12, shown on a smaller scale which depicts a single emitter in FIG. 3*a*, on the substrate 26. After the conical emitter 12 has been formed, the substrate and the emitter 12 may have a dielectric layer 40 formed over them by any conventional technique. For example, the dielectric layer could be formed of oxide which is grown or deposited. On top of the dielectric layer 40 may be deposited a silicon layer 42. The silicon layer 42 would conventionally be doped to make it conductive.

Figure 3B:
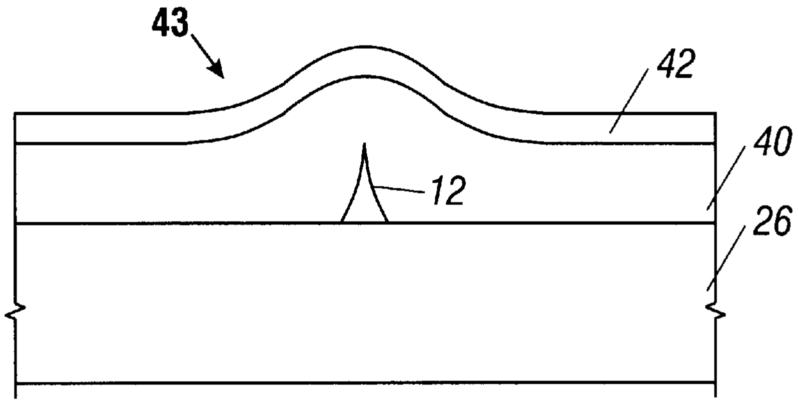
Figure 3C:
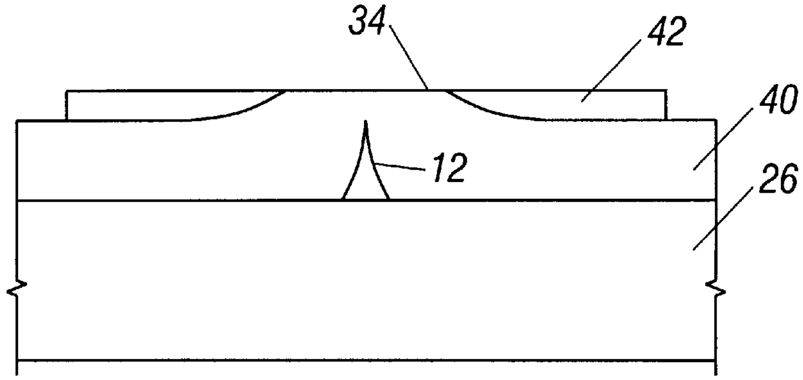

The structure shown in FIG. 3*b* is then subjected to chemical mechanical polishing in accordance with the aforementioned patent to create the structure shown in FIG. 3*c*. A hillock or hump 43 formed by the imposition of the emitter 12 is polished away to form a flat surface having an extractor 14 with an opening 34. As discussed above, the opening 34 is self-aligned to the emitter 12.

Figure 3D:
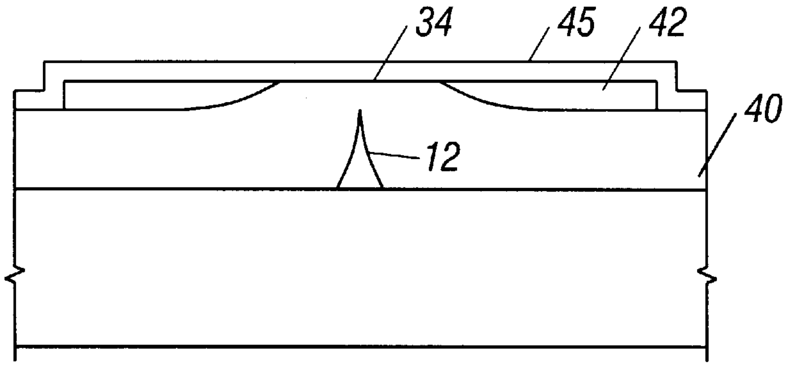

Next, a metal layer 45 is deposited over the entire structure, as shown in FIG. 3*d*. Advantageously the metal is titanium since titanium has good opaqueness to light energy. For example, 500 angstroms of titanium may be sputter deposited.

After deposition, the titanium is heated to form a titanium silicide 44. The formation of the silicide may be done by a rapid thermal process using conventional rapid thermal annealing equipment. For example, a temperature of 600° C. for thirty seconds in a nitrogen atmosphere supplied at three standard liters per minute (SAM) is satisfactory. A silicide is formed in all areas where the metal contacts silicon. As shown in FIG. 3*d*, this means that the top and sides of the silicon layer 42 have a silicide 44 formed thereon. However, silicide is not formed where there is exposed dielectric layer such as in the opening 34 in the layer 42. In particular, after the heating step, the metal that was situated on top of the oxide 46 remains in its original unsilicided form.

Figure 3E:
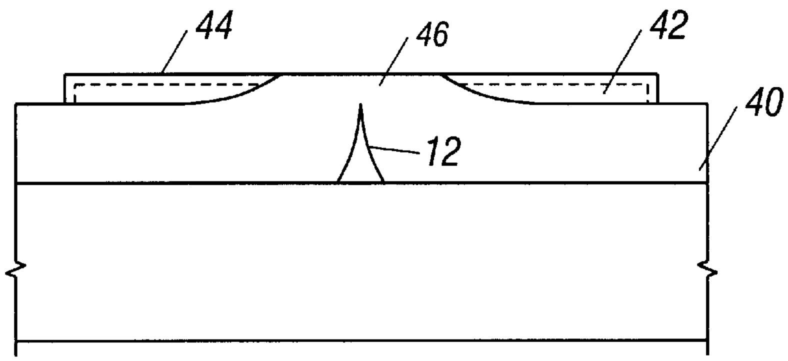
Figure 3F:
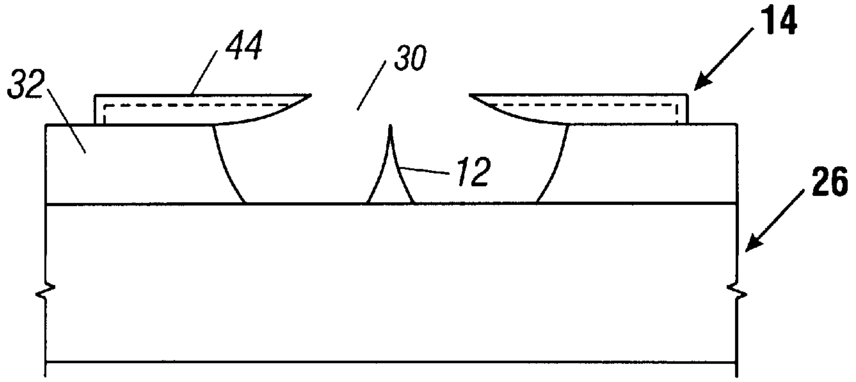

Thus, the structure shown in FIG. 3*e* is formed by etching the remaining metal with a suitable etchant. One suitable etchant is an ammonia-peroxide solution, $NH_4OH:H_2O_2:H_2O$ in a ratio of 1:1:5 for three minutes at 65° C. This etchant does not attack the silicide. It only attacks the metal so that the metal over the oxide 46 (as well as any other unreacted metal) is removed and only silicide remains.

In the next step, the silicide 44 on the surface of the layer 42 is treated to prevent damage from an ensuing oxide etch step. Namely a titanium silicide nitride is formed by heating the silicide to a temperature in excess of 1000° C. Advantageously a temperature of 1050° C. for ninety seconds is utilized using conventional rapid thermal annealing equipment. If the heating step is done in an atmosphere containing nitrogen, such as ammonia ($NH_3$), a nitrided silicide is formed. For example, the ammonia may be supplied at ten standard liters per minute (SLM).

At temperatures of 1000° C. or less, the nitride process is not effective in forming a layer which is resistant to ensuing oxide etch steps. While the exact physical and chemical processes involved are not known, it is possible that the higher temperature is more effective in forming more nitrogen reaction sites on the silicide and increasing the amount of reacted nitrogen in the silicide which is effective in preventing chemical attack.

The structure shown in FIG. 3*e* is then subjected to a buffered oxide etch (BOE). This etch would normally damage silicided material but the preceding treatment in the nitrogen atmosphere at elevated temperature results in the structure which is resistant to the oxide etch. As a result of the oxide etch, the opening 30 is formed in the oxide 32 surrounding the emitter 12.

The silicidation process is self-aligned to the emitter 12 since the silicon opening 34 was self-aligned by the chemical mechanical processing to the emitter 12 and the silicide 44 is self-aligned to both the silicon opening 34 and the emitter 12. In this way a light blocking layer which is self-aligned to the emitter can be formed which is effective in blocking light and preventing erroneous device operation, without requiring extensive additional processing steps and/or critical alignments. Moreover, by treating the silicide to prevent damage in subsequent oxide etching steps, the silicide is not substantially removed. Advantageously the extended temperatures significantly reduce the exposure of the silicide 44 to attack during ensuing oxide etch operations.

Figure 4:
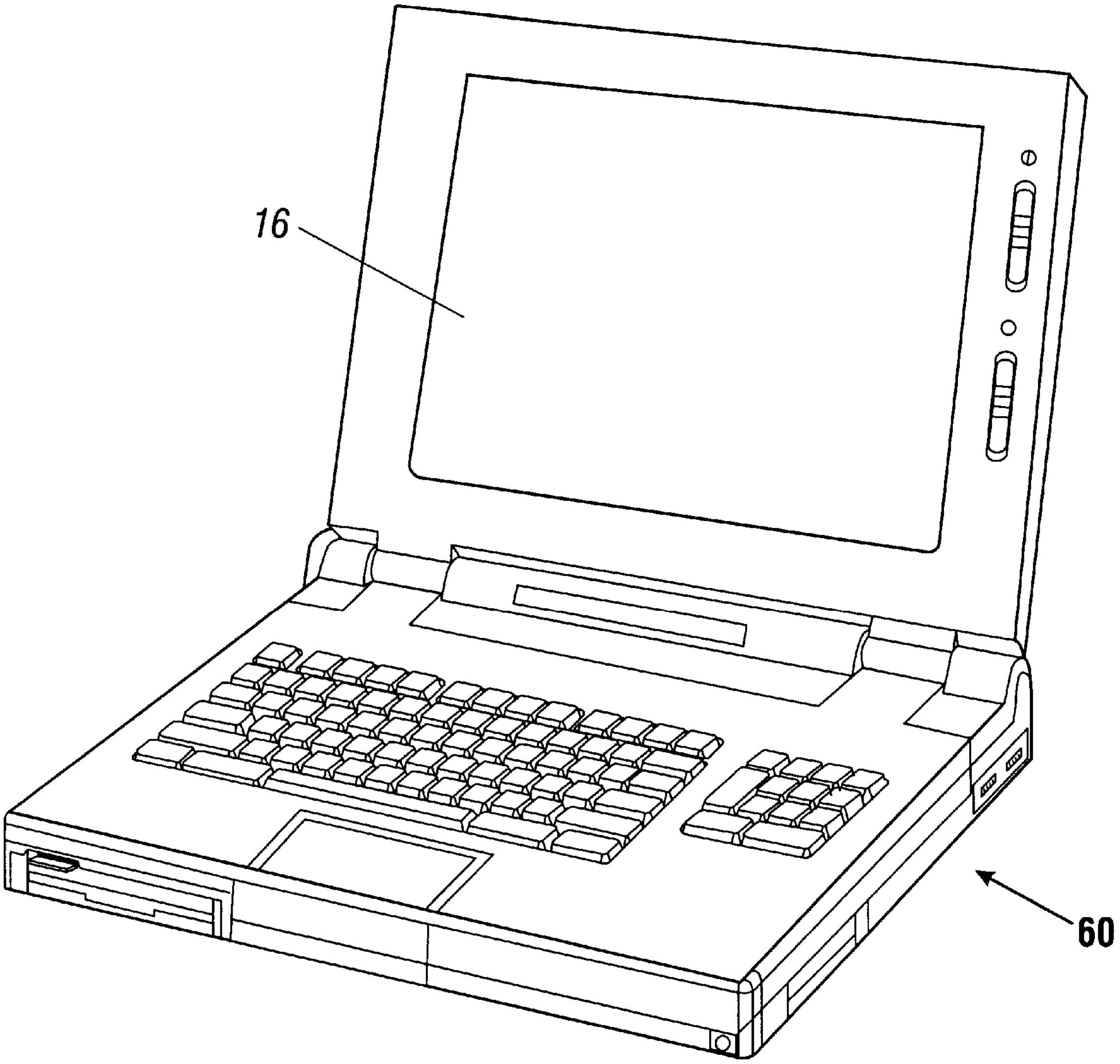
FIG. 4 is a perspective view of the field emission display in use in a computer system.

When an array of emitters 12 are formed and driven in accordance with the aforementioned patent incorporated by reference, images can be caused to appear on the screen 16 which may be perceived by the user. The screen 16 may be utilized, for example, as the display screen in a laptop computer 60, as shown in FIG. 4. The operation of the computer system is improved by preventing erroneous operation of the screen in response to stray light effects.

While the present invention has been described with respect to a limited number of preferred embodiments, those skilled in the art will appreciate a number of modifications and variations therefrom and it is intended that the appended claims cover all such modifications and variations that fall within the true spirit and scope of the present invention.

What is claimed is:

1. A method for forming a field emission display comprising the steps of:

forming an extractor;

forming a coating on said extractor to prevent light from passing through said extractor; and treating said coating to make said coating resistant to chemical attack.

2. The method of claim 1 including the steps of forming a silicided extractor and exposing said silicided extractor to a nitrogen source at a temperature of over 1000° C.

3. The method of claim 2 including the step of removing oxide from around said extractor to expose an emitter.

4. The method of claim 3 wherein said removing step includes the step of using a buffered oxide etch that also contacts said coating.

* * * * *